United States Patent

Hsu et al.

[11] Patent Number: 5,246,879
[45] Date of Patent: Sep. 21, 1993

[54] METHOD OF FORMING NANOMETER-SCALE TRENCHES AND HOLES

[75] Inventors: David S. Y. Hsu; Henry F. Gray, both of Alexandria, Va.

[73] Assignee: The United States of America as represented by the Secretary of the Navy, Washington, D.C.

[21] Appl. No.: 782,197

[22] Filed: Oct. 24, 1991

Related U.S. Application Data

[62] Division of Ser. No. 589,758, Sep. 28, 1990, Pat. No. 5,110,760.

[51] Int. Cl.$^5$ .................................................. H01L 21/44
[52] U.S. Cl. ................................... 437/180; 437/203; 437/192; 437/201; 437/245
[58] Field of Search ............... 437/180, 203, 201, 192, 437/245, 246

[56] References Cited

U.S. PATENT DOCUMENTS

| | | | |
|---|---|---|---|
| 4,570,328 | 2/1986 | Price et al. | 437/192 |
| 4,608,271 | 8/1986 | Hieber et al. | 437/200 |
| 4,874,719 | 10/1989 | Kurosawa | 437/203 |
| 4,920,012 | 4/1990 | Woodruff et al. | 378/144 |
| 4,957,880 | 9/1990 | Itoh et al. | 437/192 |
| 5,071,788 | 12/1991 | Joshi | 437/192 |
| 5,071,789 | 12/1991 | Nakata | 437/192 |
| 5,096,737 | 3/1992 | Baum et al. | 427/38 |
| 5,108,952 | 4/1992 | Matsuhashi | 437/192 |
| 5,110,760 | 5/1992 | Hsu | 437/180 |

FOREIGN PATENT DOCUMENTS 0338206 10/1989 European Pat. Off. ............. 437/203

*Primary Examiner*—Brian E. Hearn
*Assistant Examiner*—Tuan Nguyen
*Attorney, Agent, or Firm*—Barry A. Edelberg; Thomas E. McDonnell

[57] ABSTRACT

Nanometer thick metallic layers are fabricated on trenches or holes (especially vias) within a substrate by depositing, by thermal decomposition of a volatile metal-containing precursor gas in the presence of a carrier gas at low pressure, a metallic layer on a substrate surface on which one or more trenches or holes are formed. The metallic layer thus formed has an extremely small grain size, which permits the attainment of very high spatial resolution and thus permits the formation of extremely small trenches and holes, increasing the attainable memory/circuit density. This invention is useful in the fabrication of ultra-high density trench capacitors and ULSI microelectronic circuits.

22 Claims, 5 Drawing Sheets

10

METHOD OF FORMING NANOMETER-SCALE TRENCHES AND HOLES

Cross-Reference to Related Applications

This application is a divisional of U.S. Pat. Application Ser. No. 07/589,758, entitled METHOD OF NANOMETER LITHOGRAPHY, to David. S. Y. Hsu, filed Sept. 28, 1990, now U.S. Pat. No. 5,110,760 the entirety of which is incorporated herein by reference.

BACKGROUND OF THE INVENTION

1. Field of the Invention

The present invention relates generally to nanometer-scale lithography and more specifically to the formation of capacitors and other high density microelectronic devices having nanometer-scale trenches and vias.

2. Description of the Prior Art

The fabrication of dynamic RAMs (DRAMs) at the 64 Mb level and above is hampered by one's inability to fabricate capacitors which have sufficiently high capacitance. One solution is to increase the surface area of the capacitor without requiring more chip surface area. This is done by making deep trench cuts into the silicon (or GaAs) chip, with the trenches having a large depth-to-width ratio. After the trenches are cut, by Reactive Ion Etching (RIE), Orientation Dependent Etching (ODE), or other processing methods well known in the art, the entire exposed surface of the trench system is oxidized by known oxidation techniques, e.g. thermal wet oxidation or thermal dry oxidation. At this point the industry has experienced a severe problem. The surfaces of the oxidized trench system must be overlayed with a thin metal film to form the capacitor. Standard CVD processes are not very satisfactory.

In fabricating state-of-the-art ultra-large scale integrated (ULSI) microelectronic circuits in the microelectronics industry, e.g. in silicon or GaAs, one must make electrical contact from one metallization layer to another which are insulated from each other by insulating layers. In very complicated device structures, many layers of metallizations, insulation, and sometimes semiconductors are required. In more recent structures, e.g. those which will be developed in the next century, three-dimensional structures consisting of multiple layers will be fabricated. A significant difficulty with these new concepts, however, is making vertical electrical interconnections to the various metallization layers. The usual procedure is to etch a hole through a series of metallization and insulating layers, and stopping the etch as it reaches the desired metallization layer. The sides of the hole are then insulated and metallized to form the required conducting path. This metallization procedure is very hard to do with known techniques, particularly if the hole is extremely narrow, e.g. less than 1000 angstroms wide, with a large height-to-width ratio. That is, it is very hard to fabricate vias for ULSI devices. Furthermore, the hole etching process often forms non-parallel side walls which have either positive or negative slope. To make a fully conducting path, the metallization procedure must be very conformal and very uniform in thickness regardless of the shape or orientation of the surface it is put on.

SUMMARY OF THE INVENTION

It is an object of the present invention to provide a convenient and effective method for making metallized trenches for capacitors and making holes, especially vias, for ULSI devices.

It is a further object of the present invention to fabricate dynamic RAM having extremely high density memory capabilities.

It is a further object of the present invention to fabricate three-dimensional microelectronic circuits having an extremely high circuit density.

These and other objects are achieved by depositing a metallic layer, preferably of less than 0.1 micron thickness, by thermal decomposition of a volatile metal-containing precursor gas and a carrier gas, on the surfaces of a trench and on at least the vertical surfaces of a via previously formed within a substrate.

BRIEF DESCRIPTION OF THE DRAWINGS

A more complete appreciation of the invention will be readily obtained by reference to the following Description of the Preferred Embodiments and the accompanying drawings in which like numerals in different figures represent the same structures or elements, wherein.

DESCRIPTION OF THE PREFERRED EMBODIMENTS

Figure 1:
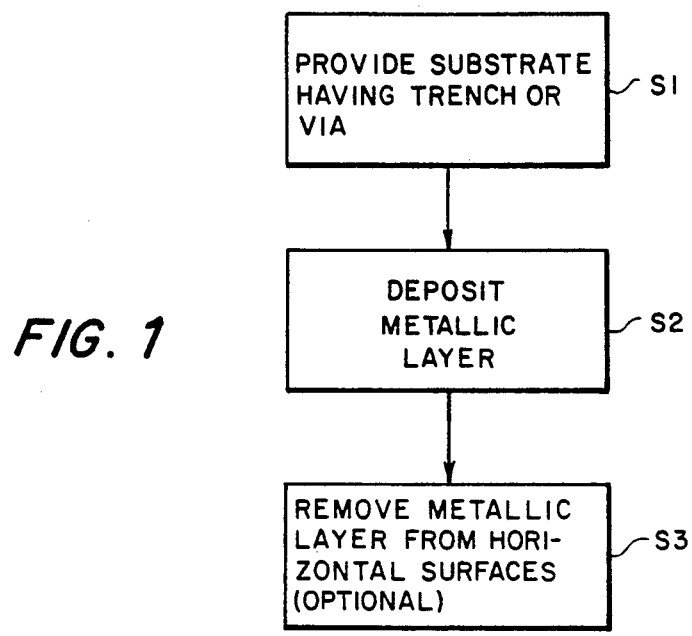
FIG. 1 is a flow chart showing the vertical sidewall fabrication process of the preferred embodiment of the present invention.
Figure 3A:
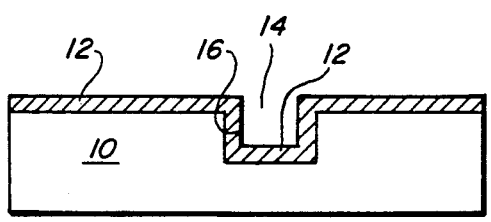
FIGS. 3A–3C are schematic side elevation views, partly in cross-section, of the resulting structures produced by the steps of FIG. 1.

Referring to the figures, at the start of the vertical sidewall formation process of the present invention (step S1 of FIG. 1), a hole (e.g., for via fabrication) or trench 14 is formed on substrate 10. If item 14 is a trench, substrate 10 is preferably formed from silicon and the exposed surfaces are oxidized to form silicon dioxide of the desired thickness. If item 14 is a to be a via, the silicon dioxide on the bottom horizontal surfaces of the hole could be removed if necessary. The via can act as an interconnect from the circuit on substrate 10 to a circuit on a layer beneath substrate 10 or a layer to be later placed above substrate 10. Hole or trench 14, having horizontal surfaces 12 and vertical surfaces 16, is advantageously formed using conventional fabrication techniques, e.g., photolithography and thermal oxide formation. The work piece thus formed is shown in FIG. 3A. Although the hole or trench 14, as shown, typically includes a bottom surface, a bottom surface is not required.

Immediately prior to the deposition of a metallic layer, the work piece is heated up in high vacuum or ultra high vacuum to a temperature of about 500° C. and is maintained for at least about 5 minutes at above 500°

C. This heat treatment prior to metal deposition greatly enhances the adhesion of the metal layer (especially where the metal is platinum) to the silicon dioxide on the substrate.

During step S2, a metallic layer 20, having a uniform thickness of metallization and a small grain size, is formed on horizontal surfaces 12 and vertical surface 16, using thermal decomposition of a metal-containing precursor. Preferably, the deposition is performed in a high vacuum reactor or an ultra high vacuum reactor under very low metal-containing precursor and carrier gas pressure conditions, unlike those in conventional CVD reactors.

Figure 2:
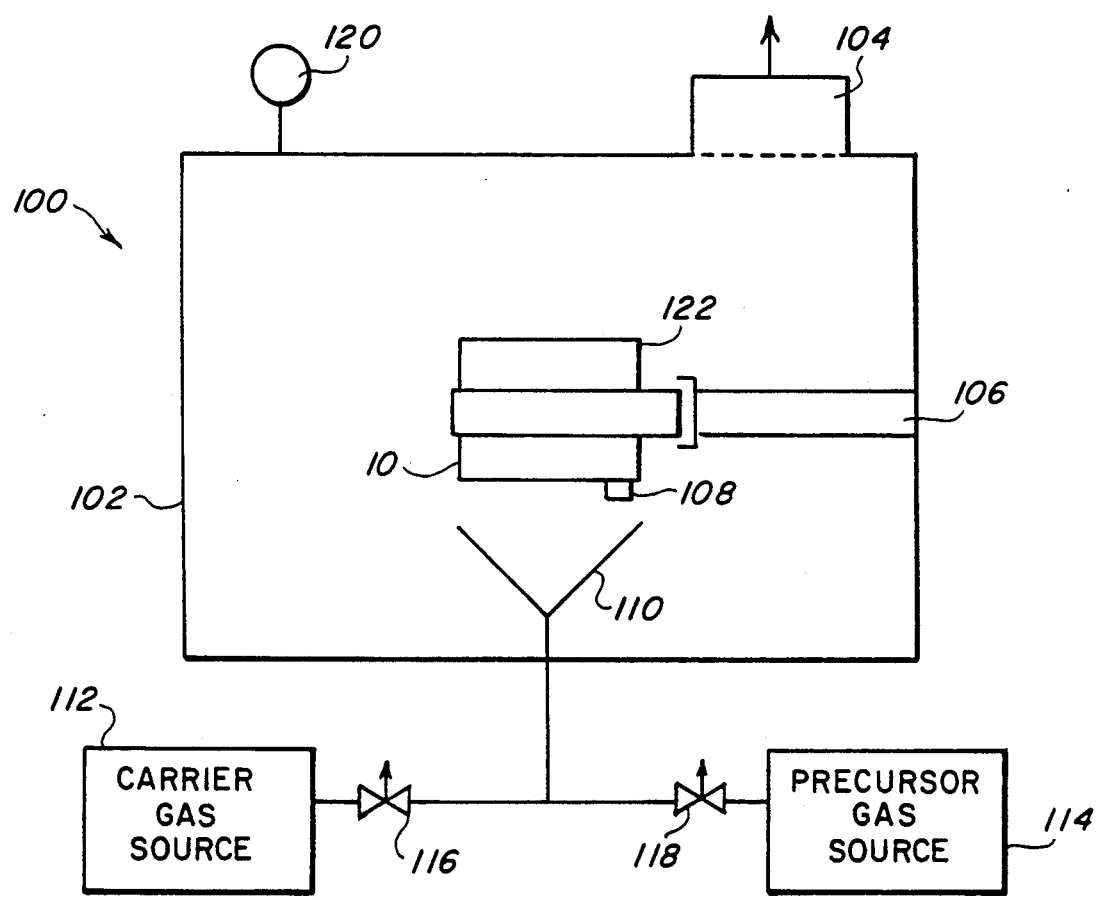
FIG. 2 is a schematic diagram showing a high vacuum reactor suitable for implementing steps S1, S2 and S3 of the flow chart of FIG. 1.
Figure 4B:
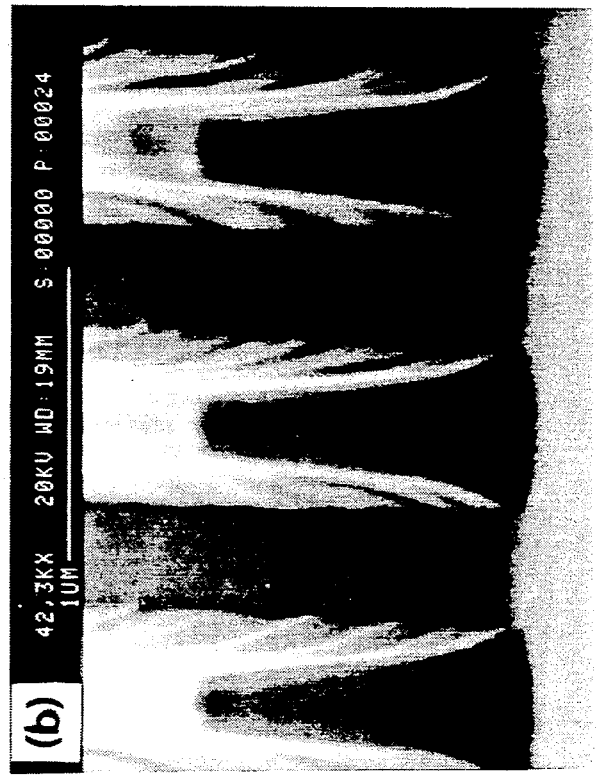
FIGS. 4A through 4D are scanning electron micrographs of (a) an end-on view of a Pt-coated trench made according to the present invention; (b) an end-on view of an uncoated trench; (c) a Pt-coated top of a trench made according to the method of the present invention; and (d) an uncoated top of a trench.
Figure 4A:
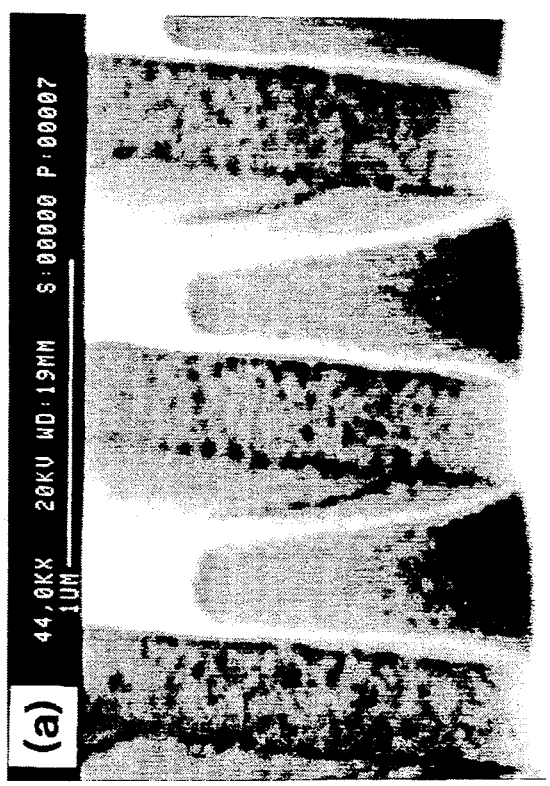
Figure 4D:
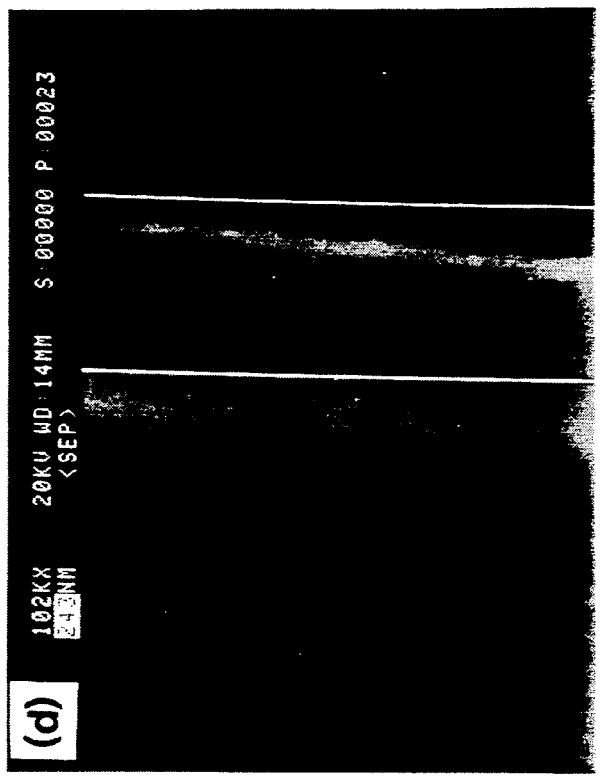
Figure 4C:
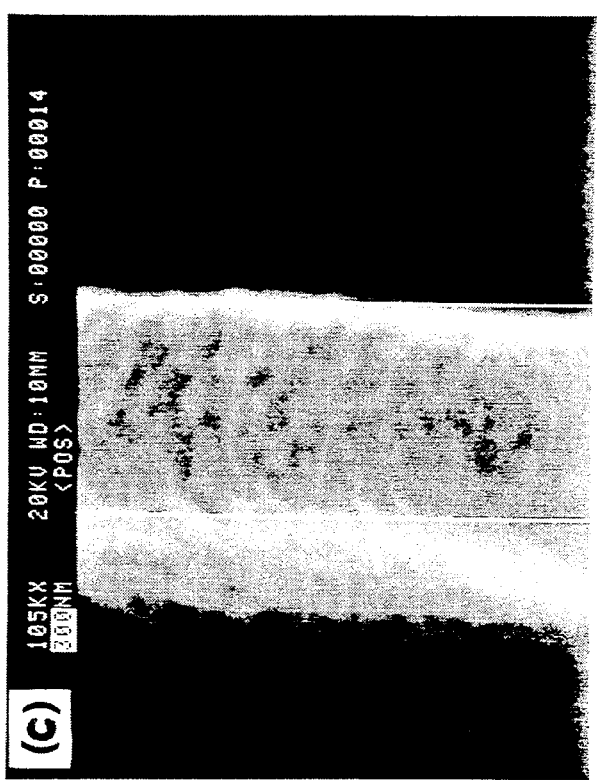

Referring to FIG. 2, an exemplary high vacuum reactor 100 is shown comprising a vacuum chamber 102 containing a pump 104 vented to the outside, a manipulator 106 for supporting and positioning substrate 10, a temperature sensor 108 for sensing the temperature of substrate 10, and a doser 110. Doser 110 is connected to carrier gas source 112 and precursor gas source 114 via metering valves 116 and 118, respectively. Preferably, the diameter of doser 110 is substantially equal to the diameter of the work piece, i.e., substrate 10. A conventional ionization gage 120 is connected to chamber 102 for measuring the partial pressures of the precursor and carrier gases. Manipulator 106 advantageously includes a conventional resistive heater 122 for controlling the temperature of substrate 10. Preferably, pump 104 is a conventional cryo-trapped diffusion pump or a turbo-molecular pump.

Figure 3B:
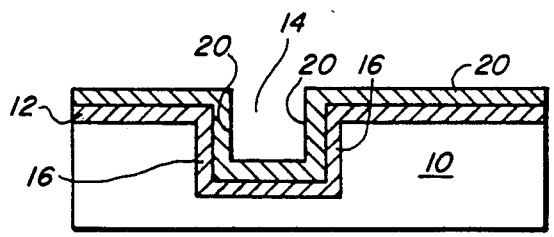

During step S2, substrate 10 is maintained at a predetermined temperature using sensor 108 and heater 122. A volatile metal-containing precursor gas and a carrier gas from doser 110 effusively flow onto substrate 10 at flow rates metered by valves 116 and 118, respectively, while pump 104 maintains chamber 102 at a predetermined partial pressure, preferably less than $10^{-4}$ Torr. Preferably, the volatile metal-containing precursor gas is selected from inorganic metal coordination compounds or organometallic compounds, including metal carbonyls. Precursor gas molecules advantageously contain ligands, e.g., $PF_3$, surrounding a metallic ion such as platinum (Pt), thereby forming a precursor gas $Pt(PF_3)$. Other metal-containing precursors, such as $Ni(PF_3)_4$, $Pd(PF_3)_4$, $Fe(PF_3)_5$, $W(PF_3)_6$, $Cr(PF_3)_6$, $Mo(PF_3)_6$, $Co(PF_3)_6$, $Ru(PF_3)_2$, $Rh_2(PF_3)_8$, $Re_2(PF_3)_{10}$, $Ir_2(PF_3)_8$, and appropriate mixtures of precursors, can also be advantageously used as the precursor gas. Preferably, the carrier gas is hydrogen. The resulting structure is shown in FIG. 3B.

It will be appreciated that the use of volatile metal-containing precursor gas advantageously provides a highly uniform film, subject to limitations from nucleation and growth characteristics inherent to the particular metal-substrate system, due to the enhanced ability of a precursor gas to diffuse on surfaces 12 and 16 prior to decomposition during the CVD process. It will be further appreciated that careful selection of the volatile metal-containing precursor gas and control of the environment in the vacuum reactor are required to achieve uniform and thin metallic film coverage on the vertical and horizontal surfaces according to the present invention. Other factors, such as nucleation, which depend on the precursor-substrate and precursor-metal and metal-metal interactions during CVD, may inhibit the formation of small grain size metallic layers on the surfaces. Metallic structures, such as vertical metallic layers with thicknesses of less than 50 nm. require a grain size substantially less than 50 nm. The use of $Pt(PF_3)_4$ as the volatile metal-containing precursor gas advantageously produces a grain size of less than 15 nm under conditions used in the present invention.

Deposition of metallic layer 20 on substrate 10 and hole or trench 14 is a thermal decomposition process employing chemical beam epitaxy conditions and is therefore dependent on the partial pressure of the precursor and carrier gases as well as on the temperature of substrate 10. For example, the deposition rate of metallic layer 20 is controlled by the substrate 10 temperature. Temperatures below about 230° C. result in a deposition rate for effective processing. Temperatures above about 300° C. produce high deposition rates, but also reduce the control over the film thickness. In addition, higher temperatures increase the grain size of layer 20, thereby lowering the achievable resolution. Thus, grain size formation and metal film deposition rate is controlled by controlling the processing temperature.

Deposition of metallic layer 20 on substrate 10 and hole or trench 14 is further dependant on the partial pressure of the precursor and carrier gases. Preferably, chemical beam epitaxy conditions are used, although the process of the present invention may also work at higher deposition pressures. A relatively low partial pressure, i.e., below about $10^{-3}$ Torr and preferably between about $10^{-5}$ and $10^{-6}$ Torr, of the precursor gas allows formation of a non-porous high purity metallic layer 20 if not affected by possible inherently adverse nucleation and growth processes. Volatile metal-containing precursor gases have room temperature vapor pressures of at least about $10^{-7}$ Torr, preferably at least $10^{-6}$ Torr and most preferably at least $10^{-5}$ Torr. Maintaining the precursor gas at a predetermined low partial pressure advantageously provides a longer distance for the precursor gas to diffuse on the surface, thus permitting formation of a uniform film and inherently offers greater control over the thickness of the film to be deposited. In addition, less side reactions occur than in conventional CVD. As the partial pressure of the precursor gas increases, the deposition rate increases with the resulting loss of control over the thickness and resolution. A lower processing temperature advantageously compensates for a high partial pressure up to a point.

The partial pressure of the carrier gas is preferably at least about 5 to 10 times higher than the partial pressure of the precursor gas. The flow rate of the carrier gas must be high enough to produce a uniform distribution of precursor gas across the area of substrate 10 where metallic layer 20 deposition is to occur. In addition, the nature and the flow rate of the carrier gas is selected so as to provide for scavenging of the precursor gas decomposition products, to form highly volatile products that can easily escape from the surface, thus preventing incorporation of decomposition products into the metallic layer 20. The total pressure in the reactor, however, must not be too high so as to impede the rapid desorption of decomposition or scavenging reaction products. Preferably the carrier gas prevents oxidation of the materials forming substrate 10, hole, trench 14 and metallic layer 20. Hydrogen and/or deuterium can be advantageously used as the antioxidant carrier gas.

In the preferred embodiment, the volatile metal-containing precursor gas advantageously has a vaporization pressure at room temperature greater than $10^{-5}$ Torr. In reactor 100, the partial pressure of the precursor gas is controlled by valve 118 to be at least about $2 \times 10^{-6}$ Torr, while the hydrogen carrier gas has a partial pressure, metered by valve 116, of about $2 \times 10^{-5}$ Torr. With the substrate 10 temperature in the range of about 280°-300° C., and using a dosing time of about 5-15 minutes, metallic layer 20 having a suitably small grain size and a thickness of about 50-150 nm is formed. Substrate 10 temperatures as low as 230° C. can be used. Considerable reductions in layer thickness can be obtained by reducing the precursor gas pressure and dosing times. It is likely that the grain size can be reduced to less than 10 nm. The layer thickness, e.g. linewidth, of 20 nm is achievable.

Figure 3C:
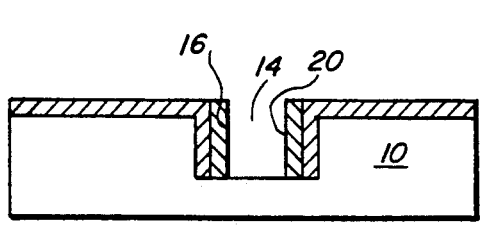

During Step S3, if needed, some or all of the portion of metallic layer 20 on the horizontal surface 12 is removed by conventional etching methods. i.e., unidirectional low energy ion beam sputtering or RIE, thereby producing the structure shown in FIG. 3C. Thus, metallized trenches or holes are formed from metallic layer 20 on the substrate 10. By the use of appropriate techniques, such as masking, metallization 20 can be retained on the bottom of the item 14, if desired.

The method of the present invention also controls the temperature of the substrate as needed for the more uniform deposition of metal layer on partially enclosed surfaces such as the sides and bottoms of holes, channels, and trenches. The top of the substrate contains the opening and is where the effusive precursor gas stream will impinge the substrate first. Consider a hole, for example. The upper parts of the wall inside the hole will experience more collisions with the precursor gas molecules. If the temperature throughout the thickness of the substrate is the same, more metal will be deposited on the upper parts than the lower parts of the hole, resulting in film non-uniformity in the hole. However, since the rate of deposition increases with temperature, a temperature gradient between the top and bottom of the substrate with the top at a lower temperature than that of the bottom can help achieve a more uniform film on the entire surface inside the hole. In other words, the higher decomposition probability of the precursor gas compensates for the lower number density of the undecomposed precursor gas in the lower part of the hole. In the original experimental arrangement such a temperature gradient did already exist to some extent, since the heater normally was in direct contact with the bottom of the substrate and the top of the substrate was being collided with room temperature gas. If a larger temperature gradient is required, the top of the substrate can be made cooler by any other artificial means such as being bombarded with separately-directed chilled carrier or inert gases. Sensors attached to top, bottom, or intermediate parts of the substrate can provide temperature gradient monitoring. The temperature gradient required to provide a uniform metallization, within the desired tolerances of the trench or hole can be determined empirically, without undue experimentation.

Having described the invention, the following examples are given to illustrate specific applications of the invention including the best mode now known to perform the invention. These specific examples are not intended to limit the scope of the invention described in this application.

EXAMPLES

Two sets of silicon trenches, 0.5 micron wide-1.5 micron deep, were fabricated using standard dry etching processes. A silicon dioxide layer of 480 Angstrom thickness was thermally grown on the trench surfaces by a standard oxidation process.

A thin layer of platinum metal was conformally deposited over the surfaces of the trenches using the same deposition procedure disclosed in the Examples accompanying the parent application. The scanning electron microscopy photographs of FIGS. 4A through 4D showed complete and conformal coverage of the trench surfaces (top, sidewall and bottom). They revealed no evidence of any "overhang" of platinum near the entrances of the trenches. A comparison of the top SEM views of platinum coated-and uncoated trenches approximates the platinum film thickness to be 20-40 nanometer. The grain sizes are about 20-30 nonometer.

Figure 5:
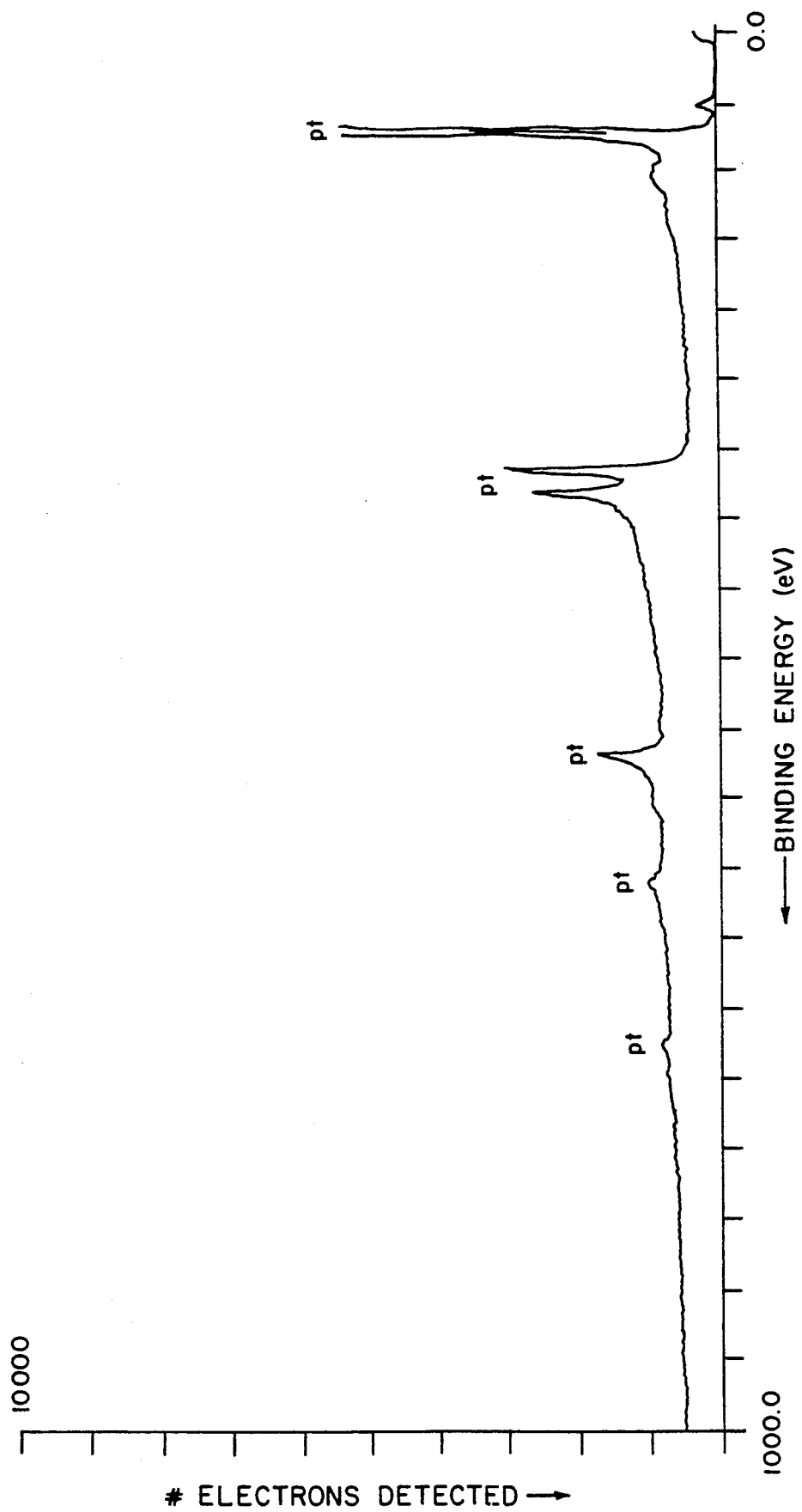
FIG. 5 is a XPS analysis of a platinum film on $SiO_2$, deposited by the thermal decomposition of a volatile metal-containing precursor gas and a carrier gas according to the present invention.

The platinum films of the two samples used in the experiments were well-bonded to the substrate. (e.g. they passed the "scotch tape" test and showed no sign of peeling when scratched with a scribe.) XPS analysis of a platinum film (spectra in FIG. 5) deposited in $SiO_2$ using the same conditions with the same method showed no detectable level of impurities, not even oxygen (the film was sputtered for a few seconds to remove surface hydrocarbons and oxygen picked up from the air). Platinum was the only element detected.

The method of the present invention advantageously can be used in conformally metallizing surfaces of three-dimensional micro- and nanostructures of different contours and aspect ratios. Thus, the present invention can be used in forming trench capacitors useful for high density dynamic random access memory and in the production of vias and other components for ULSI.

It will also be appreciated that a relatively high purity metallic layer 20, i.e., containing no detectable fluorine or phosphorus decomposition byproducts, is obtained because the low pressure of the precursor gas and carrier gas allow the impurity byproducts to escape rather than to be buried in metallic layer 20.

The process of the present invention, which employs extremely low precursor and carrier gas partial pressures (and thus extremely low total system pressure) is entirely different from prior processes operating at atmospheric pressure, or somewhat less than atmospheric pressure, and low precursor gas partial pressures. In those prior processes, activation of the precursor occurs by collision with surrounding gas particles. In the present invention, the concentration of surrounding gas particles is too low to significantly activate the precursor. Thus, the results obtained according to the present invention could not have been predicted from the results obtained according to these prior processes.

Other modifications and variations to the invention will be apparent to those skilled in the art from the foregoing disclosure and teachings. Thus, while only certain embodiments of the invention have been specifically described herein, it will be apparent that numerous modifications may be made thereto without departing from the spirit and scope of the invention.

What is claimed is:

1. A method for microfabricating a metallization upon a hole or trench in a horizontal surface of a substrate, said hole or trench having at least one vertical surface, comprising the steps of:
   providing a substrate having at least one hole or trench thereon;
   depositing a layer of metal having a thickness of less than 0.1 micron on said at least one vertical surface by thermal decomposition of a volatile metal-containing precursor gas and a carrier gas, said carrier gas having a partial pressure of less than about $10^{-2}$ Torr, and the partial pressure of said carrier gas being about 5 to 10 times higher than the partial pressure of the precursor gas.

2. The method of claim 1, wherein said hole or trench includes a horizontal surface and said layer of metal is deposited by said thermal decomposition upon said horizontal surface.

3. The method of claim 1, wherein said at least one vertical surface of said substrate is $SiO_2$.

4. The method of claim 1, wherein said metal layer is deposited under chemical beam epitaxy conditions.

5. The method of claim 1, wherein said substrate has at least one via.

6. The method of claim 1, wherein said metal layer is deposited by thermal decomposition of said volatile metal-containing precursor gas is selected from the group consisting of inorganic metal coordination compounds and organometallic compounds.

7. The method of claim 6, wherein said precursor gas contains $PF_3$ ligands.

8. The method of claim 6, wherein said precursor gas contains platinum.

9. The method of claim 6, wherein said precursor gas is selected from the group consisting of $Pt(PF_3)_4$, $Ni(PF_3)_4$, $Pd(PF_3)_4$, $Fe(PF_3)_5$, $W(PF_3)_6$, $Cr(PF_3)_6$, $Mo(PF_3)_6$, $Co(PF_3)_6$, $Ru(PF_3)_5$, $Rh_2(PF_3)_8$, $Re_2(PF_3)_{10}$ and $Ir_2(PF_3)_8$.

10. The method of claim 6, wherein said carrier gas is hydrogen.

11. The method of claim 6, wherein said precursor gas has a vapor pressure at room temperature of at least $10^{-7}$ Torr.

12. The method of claim 6, wherein the partial pressures of said precursor gas and said carrier gas are less than about $10^{-4}$ Torr.

13. The method of claim 1, further comprising the step of applying a thermal gradient between a top and bottom of said hole or trench during said thermal decomposition, the temperature at said bottom being higher than the temperature at said top, wherein the rate of thermal decomposition of said precursor at said bottom is increased sufficiently with respect to the rate of thermal decomposition of said precursor at said top so that said deposited metal layer on said hole or trench is of essentially uniform thickness.

14. The method of claim 13, wherein said hole or trench includes a horizontal surface and said layer of metal is deposited by said thermal decomposition upon said horizontal surface.

15. The method of claim 14, wherein said precursor gas contains $PF_3$ ligands.

16. The method of claim 14, wherein said precursor gas contains platinum.

17. The method of claim 14, wherein said precursor gas is selected from the group consisting of $Pt(PF_3)_4$, $Ni(PF_3)_4$, $Pd(PF_3)_4$, $Fe(PF_3)_5$, $W(PF_3)_6$, $Cr(PF_3)_6$, $Mo(PF_3)_6$, $Co(PF_3)_6$, $Ru(PF_3)_5$, $Rh_2(PF_3)_5$, $Re_2(PF_3)_{10}$ and $Ir_2(PF_3)_8$.

18. The method of claim 1, wherein said hole or trench has a width of less than 1000 angstroms.

19. The method of claim 18, wherein the ratio of the depth of said trench of hole to the width of said trench or hole is at least about 3:1.

20. The method of claim 1, wherein said substrate is a chip into which said trenches have been cut to increase the surface are of a trench capacitor fabricated from said chip and used as dynamic random access memory.

21. The method of claim 1, further comprising the step of depositing an additional metal upon said deposited metal layer to provide a multilayer structure.

22. The method of claim 1, wherein said substrate is silicon, said substrate is at a temperature of above 300° C. during said depositing step, and silicon from said substrate diffuses into said deposited metal layer and reacts with said layer of metal to form metal silicide.

* * * * *

UNITED STATES PATENT AND TRADEMARK OFFICE
CERTIFICATE OF CORRECTION

PATENT NO. : 5,246,879

DATED : September 21, 1993

INVENTOR(S) : David S. Y. Hsu and Henry F. Gray

It is certified that error appears in the above-identified patent and that said Letters Patent is hereby corrected as shown below:

> Title page, Item 54, line 1 after "METHOD OF" change "FORMING" to --COATING--;
> Title page, Item 57, line 10 change "formation" to --coating--;
> Column 2, lines 1 and 2 rewrite "trenches for capacitors and making holes, especially vias, for ULSI devices" to --trenches and holes for capacitors and vias, for ULSI devices--.

Signed and Sealed this

Fifth Day of July, 1994

BRUCE LEHMAN

*Attest:*

*Attesting Officer*  *Commissioner of Patents and Trademarks*